United States Patent [19]

Ray

[11] Patent Number: 4,649,267
[45] Date of Patent: Mar. 10, 1987

[54] AUTOMATIC GAIN CONTROL CIRCUIT FOR ENCODER

[75] Inventor: David J. Ray, San Juan Capistrano, Calif.

[73] Assignee: ILC Technology, Inc., Sunnyvale, Calif.

[21] Appl. No.: 604,325

[22] Filed: Apr. 26, 1984

[51] Int. Cl.$^4$ .......................... G01J 1/32; G01D 5/34
[52] U.S. Cl. .............................. 250/205; 250/231 SE; 330/308
[58] Field of Search .................... 250/205, 231 SE; 330/59, 279, 281, 308

[56] References Cited

U.S. PATENT DOCUMENTS 4,190,747  2/1980  Feiner et al. ................. 250/205 X
4,250,488  2/1981  Haupt ............................. 250/205 X Primary Examiner—Eugene R. LaRoche
Assistant Examiner—Steven J. Mottola
Attorney, Agent, or Firm—Marvin H. Kleinberg

[57] ABSTRACT

A gain control circuit for a light source in an optical encoder derives a signal from the phototransducers that receive the light through the encoder disc. In one embodiment, a signal is taken between the transducer and potential source and in alternative embodiments the signal is taken from the phototransducer output. If a periodic index pulse is generated, a correcting circuit compensates for its effect. Where all of the transducers do not receive a substantially constant continuing illumination level, a filter-integrator circuit provides the d.c. component to the gain control circuit.

7 Claims, 6 Drawing Figures

AUTOMATIC GAIN CONTROL CIRCUIT FOR ENCODER

BACKGROUND OF THE INVENTION

1. Field of the Invention

The present invention relates to automatic gain control circuits and, more particularly, to a gain control circuit useful in a position encoder.

2. Description of the Prior Art

In recent years, optical encoders have been developed employing a combination of a light source and light detectors, which are separated by an apparatus on a rotatable shaft for interrupting the light in predetermined fashion as the shaft is moved. Optical encoders are typically employed to detect and signal the angular position and velocity of a rotating shaft and are especially useful for systems that control the position and velocity of carriages and print wheels in printers.

An incremental encoder disc contains a plurality of alternating clear and opaque sectors in a predetermined circumferential pattern which rotates with the shaft. The disc may cooperate with a suitable masking device to limit the light that impinges upon a photosensitive transducer to signal the passage of the sectors.

With encoders that must be fitted in a small area and where a premium is placed upon a compact package, designers have turned to photo emissive devices such light emitting diodes, operating in conjunction with a plurality of photodetectors that may be part of a single semiconductor substrate. For example, a commercially successful device which utilizes a silicon chip having a single diffusion layer with several separate photocells formed thereon is employed in an optical encoder produced by the assignee of the present invention, which is described in the recent patent to Weber, U.S. Pat. No. 4,224,514, issued Sept. 23, 1980.

In that patent, a gain control circuit was described which relied upon a dedicated photodetector that viewed an uninterrupted portion of the light beam from the light source. A feedback circuit was then devised which regulated the voltage to the light emitting diode to maintain a certain desired signal level from the photo detector.

A similar concept was disclosed in the patent to Grundherr, U.S. Pat. No. 4,118,129, issued Oct. 3, 1978 for a Rotary Wheel Printing System. In this apparatus a pair of series connected LED's was controlled by a separate photocell which received radiant energy directly from both LED's, and which was used in a feed-back circuit to control the voltage and therefore the brightness of the LED elements.

While the optical encoder of Weber has proven to be commercially successful, it has been deemed desirable to reduce the area that must be illuminated by the light emitting diode, and to concentrate more of the illumination on the phototransducers that are in the direct path of the optical encoder disc. If the separate feed-back photo detector could be eliminated then the LED and its lens could be redesigned to direct substantially all of the illumination to the main photo detectors, which Weber utilized to obtain position and velocity information.

Weber teaches two pairs of detectors in a quadrature arrangement so that the two detectors of one pair are respectively exposed and occluded simultaneously with respect to the light source. The detectors of the other pair, which are effectively phased to be 90 degrees from the first pair, are both partially illuminated. As the code disc revolves, of the two apertures that were partially obscured, one becomes completely obscured while the other is completely open. Of the other pair, both become partially obscured and therefore partially illuminated.

The net result is, that of the four photo detectors, at each increment of movement, only one sensor is totally obscured, one sensor is completely exposed and the remaining two sensors are half obscured. If one assumes that the total available light flux for one of the photo detectors is X, then four detectors will, at all times, receive a light flux of 2X, shared among the sensors. As the encoder and disc rotate, the distribution of light flux varies, but the net illumination at any instant in time, in this embodiment, remains 2X.

If the magnitude of the photo detector signal remains constant and is sufficiently above the noise level, then subsequent amplification stages can bring the output of the encoder to any desired level. The embodiments described do not materially affect the amplitude of the waveform.

BRIEF SUMMARY OF THE INVENTION

It has been discovered that, rather than adding an additional, dedicated photo detector, the existing photo detectors can be utilized to provide a control signal. A gain circuit or feedback loop can be driven by the control signal to assure a useful light output from the radiant energy source, which conventionally may be a light emitting diode.

In a first embodiment, as in Weber, the photo transducers are formed from a common silicon chip having a single diffusion layer and can be indicated schematically as diodes. One terminal, either anode or cathode of each diode commonly connects to a source of common reference potential. A resistor can be interposed between the reference potential source and the detectors so that when current is drawn through any of the diodes, a voltage signal drives a feedback circuit that controls the voltage on the light emitting diode. The circuit maintains the response of the photo transducers to the impinging radiation at a predetermined level.

In connection with an alternative embodiment, it can be noted that each of the photo transducers is connected to drive its own amplifier. The individual amplifier outputs can be tapped and combined at a summing junction. That signal, too, can be compared to a reference signal to derive an error signal for controlling the light source.

Other variations of the invention may employ systems using fewer or more phototransducers, in which the average illumination on the sensors is, at all times, some predetermined fraction of the total potential illumination. These systems, too, utilize similar techniques to derive a feedback signal for the light source. So long as the sensitivity of the encoder system is not adversely affected by the derivation of the feedback signal from the response of the phototransducer to the impinging illumination, the technique of the present invention is applicable.

In many encoders, and especially the incremental encoders, a secondary or index aperture is provided with its own phototransducer to define an index or starting position for the movable object. If the index phototransducer is commonly connected with the other phototransducers, and the control signal is derived from the common connection, the periodic change in total received signal must be compensated, so as not to force a momentary reduction in the output of the light source each time the index aperture is detected.

According to certain embodiments of the present invention, a compensating signal is derived from the output of the index phototransducer. This signal offsets the effect of the increase in signal magnitude at the moment that the index aperture permits illumination of the index phototransducer.

In the alternate embodiments of the invention, in which individual output signals from the individual phototransdcuers are utilized, no provision need be made for the index signal, since the index phototransducer need not be included in the creation of the signal that drives the gain circuit.

DETAILED DESCRIPTION OF THE DRAWINGS

Figure 1:
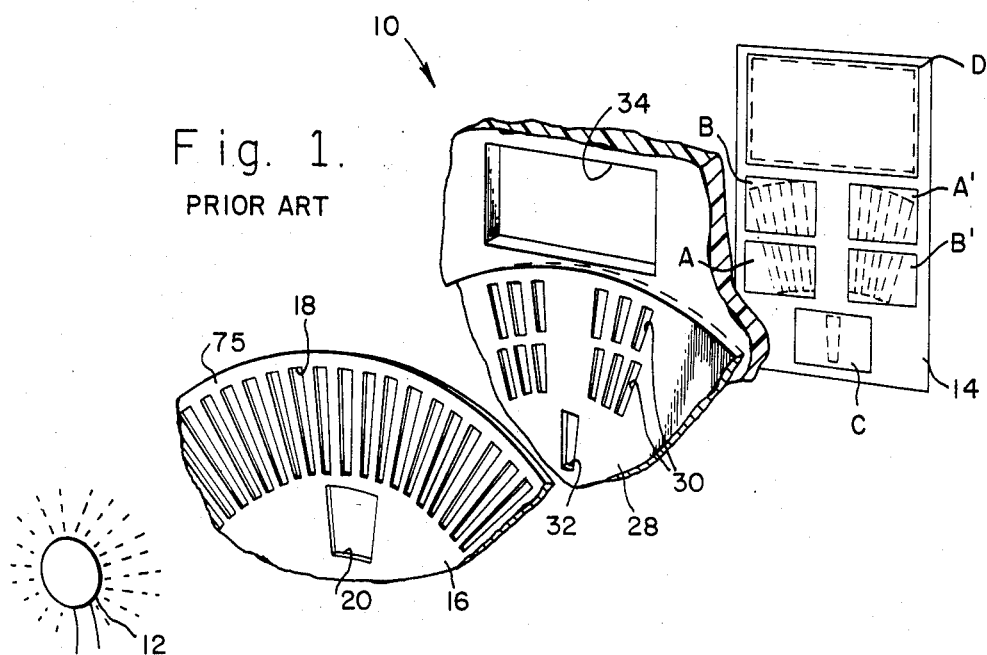
FIG. 1 is exploded, idealized perspective view of a prior art encoder.

Referring now to the drawings, and particularly to FIG. 1, a prior art optical shaft encoder 10 is suggested in an exploded view. The encoder is used with a rotatable shaft (not shown) and is operable to produce a number of electrical signals representative of the angular position and velocity of the shaft. The encoder 10 includes a source of radiant energy or light, preferably in the form of an LED 12, and a phototransducer array 14, adapted to receive light from the LED 12.

The encoder further includes a code disc 16, which has a hub portion coupled to the rotatable shaft, and which has a plurality of circumferentially aligned transparent apertures 18 to alternately block and permit transmission of the light to each of the various segments of the phototransducer array 14 as the disc 16 is rotated.

The apertures 18 in the code disc 16 are arranged in two circumferential tracks, an outer track 20 containing apertures 18, substantially evenly distributed around the perimeter of the disk 16, and an inner track 22, containing a single aperture 24, representative of an index or "home" position. A typical encoder may use approximately 200 apertures.

Associated with the outer track 18 of the code disk 16 are four sensor segments A, A', B, and B', each adapted to produce an electrical current proportional to the amount of light it receives. The currents produced by the segments A and A' are processed by the encoder circuits to produce a first oscillatory signal having a phase angle representative of the angular position and velocity of the shaft. Similarly, the currents produced by the segments B and B' are processed by the encoder circuits to produce a second oscillatory signal, which has a phase angle that lags or leads that of the first signal by 90 degrees, depending on the direction of rotation of the shaft and disc.

Associated with the inner or index track 20 of the code disk 16 is a single sensor segment C. Electrical current produced by this segment is utilized to produce an index pulse signal. Such an index pulse is desirable with incremental encoders to synchronize counters and other electronic circuits with an arbitrary starting location.

The phototransducer array 14 is disposed behind a sensor mask 28 which, in combination with the apertures 18 on the code disk 16, causes the two sensors in each pair of sensor segments, A-A' or BB', to be alternatively illuminated in a predetermined fashion. At periodic angular positions of the disk, one sensor in each such pair is fully illuminated, while the other sensor receives no light while the sensors of the other pair are partially illuminated. As the disk is rotated, the amount of light impinging on each sensor segment continuously varies in a smooth fashion between zero and a peak amount.

As shown, the phototransducer array 14 is formed from a common silicon chip that includes a plurality of segments of a single diffusion layer. The separate sensor segments in the array can be formed by a conventional mesa or planar process that includes steps for electrically isolating the diffusion layer into individual cells. Where space permits, separate transducers could be employed, if desired.

Figure 2:
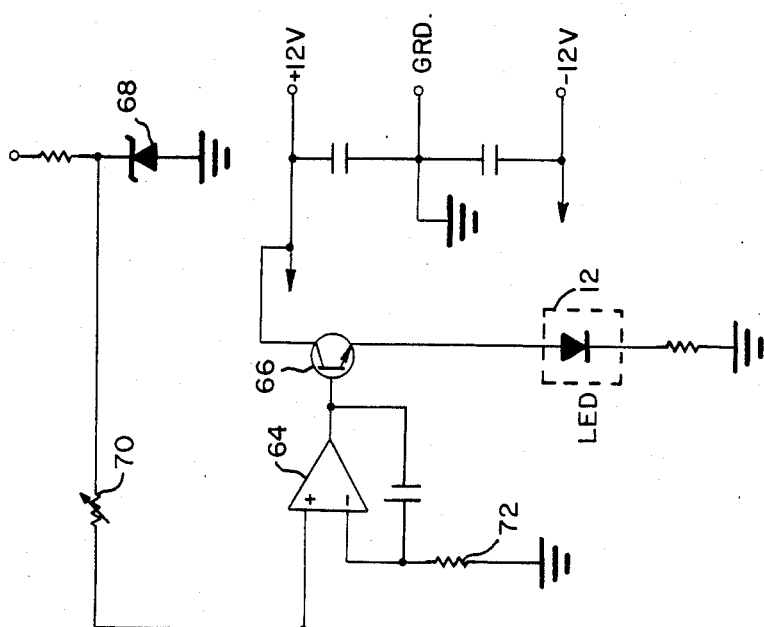
FIG. 2 is a circuit diagram of the prior art encoder of FIG. 1.
Figure 2:
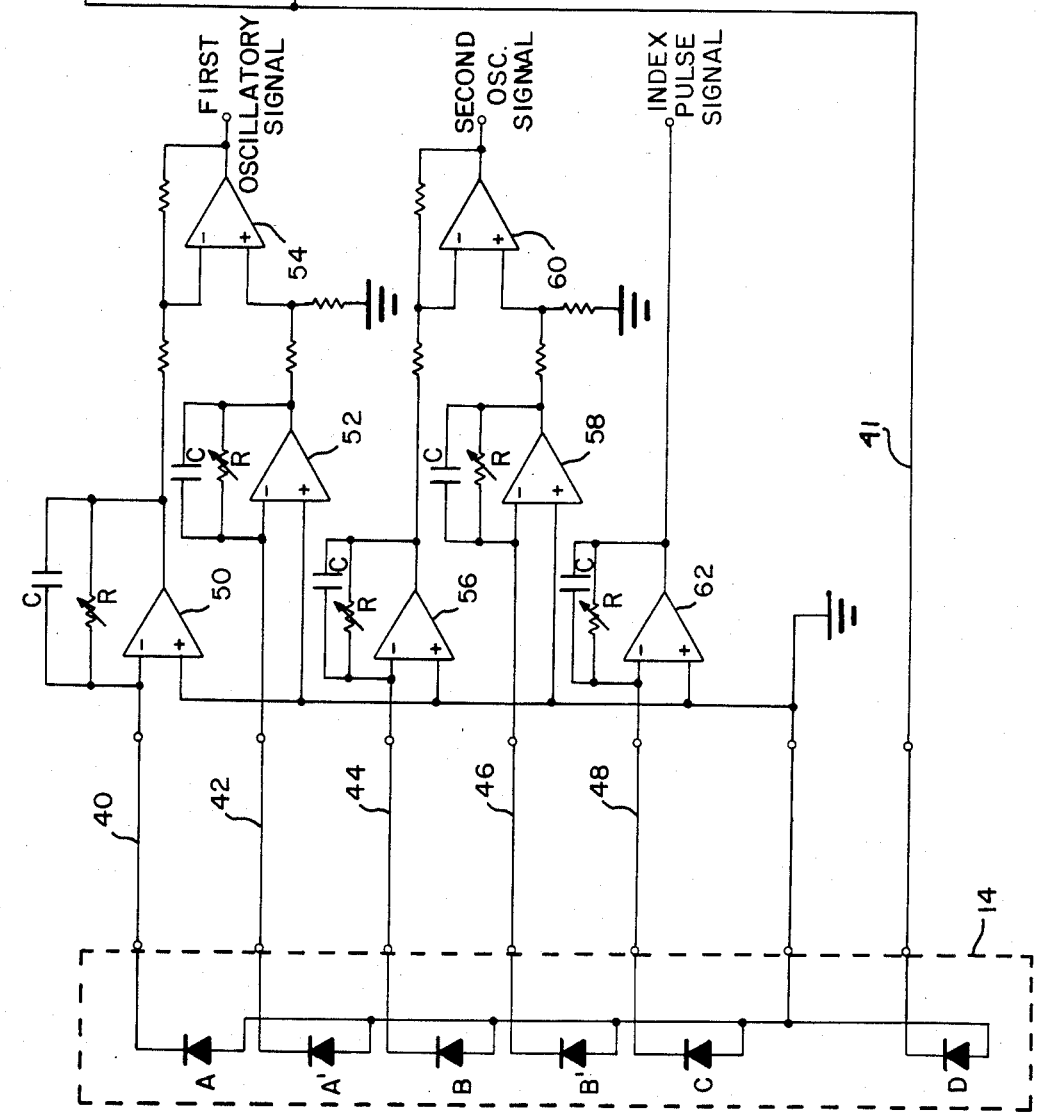

Electrical currents produced by the separate sensors in each pair of sensors A-A' and B-B' are amplified separately and then combined in a pair of differential amplifiers 54 and 60, connected in a push-pull circuit arrangement, as shown in FIG. 2. This produces the two oscillatory signals, which are symmetric about a precise reference level of zero volts.

As a result, variations in the light intensity and non-linearities in the transducing characteristics or sensitivities of the phototransducers or sensors will affect the peak voltage levels in the oscillatory signals, but not the timing of their successive zero crossings. Accordingly, the zero crossings can constitute an accurate indication of the angular position of the shaft. The signals can then be used effectively in a precision servo apparatus (not shown) for control of the angular position and velocity of the shaft.

If the separate segments in the phototransducer array 14, i.e, the two pairs of sensors A-A' and B-B' and the separate sensor segment C, are formed from a common silicon chip having a single diffusion layer, they all have substantially similar transducing sensitivities, i.e, each segment produces approximately the same electrical current in response to the same amount of light. Additionally, the separate photocell segments can be spaced closely together to insure that they receive light of substantially equal intensity, thereby permitting use of an LED 12 having a relatively narrow beam angle.

In the preferred embodiment, the sensor mask 28 includes a separate set of three elongated openings 30 over each of the sensor segments A, A', B and B', and a single, wider elongated opening 32 over the sensor segment C. As shown, the spacing between the three openings 30 in each set corresponds to the spacing between the apertures 18 in the code disk 16, so that as the disk is rotated, the three distinct regions underlying the mask apertures in each sensor segment are simultaneously illuminated in a periodic fashion.

The apertures 18 and the mask openings 30 are shown as being substantially rectangular. The width of each can, but need not be substantially equal to the distance between adjacent apertures. When the code disk is rotated at a constant angular velocity, the amount of area illuminated on each of sensor segments A, A', B and B', will vary substantially linearly between a minimum area (zero) and a maximum area. As a result, each such sensor segment will produce an electrical current signal that is substantially triangular in shape, varying substantially linearly betwen zero and a maximum. If the mask and disk apertures are dissimilar in width, the triangular wave shape will be truncated, but the operation is neither adversely affected nor materially changed.

The prior art electrical circuitry for the encoder is depicted schematically in FIG. 2. The electrical currents, developed by the various photocell segments of the sensor array 14, i.e., the two segments A and A' (illustrated using the conventional diode symbol) for producing the first oscillator signal, the two segments B and B' for producing the second oscillatory signal, and the segment C for producing the index pulse signal are all respectively transmitted over lines 40, 42, 44, 46, 48 and 41 to operational amplifiers 50, 52, 56, 58, and 62, respectively.

In a conventional manner, these amplifiers convert applied electrical currents into corresponding electrical voltages. The feedback loop of each operational amplifier includes a resistor R for providing the desired signal gain, and a capacitor C for stability. The resistors R are suitably trimmed, adjusted or selected so that each amplifier produces a peak voltage corresponding to a predetermined level. In an operating embodiment, the peak voltage level for each of amplifiers 50, 52, 56 and 58 was 0.50 volts, 54 was 6.0 volts.

The output signals of the A and A' operational amplifiers 50 and 52 are suitably combined in a differential amplifier 54, to produce a first oscillatory signal for output by the encoder. Similarly, the output signals of the B and B' amplifiers 56, 58 are combined in a B differential amplifier 60, to produce a second oscillatory signal output by the encoder. The output of the C amplifier 62 constitutes the index pulse signal for output by the encoder.

With reference to FIGS. 1 and 2, the optical shaft encoder of the prior art further included control means for regulating the electrical current supplied to the LED 12, thereby producing a controllable light intensity. The control means included a separate photocell segment D, which was formed on the same common silicon substrate as the other photocell segments (i.e., A, A', B, B' and C) and which was adapted to sense the intensity of the light beam produced by the LED 12, unobscured by the code disk 16. That segment D applies its signal to the amplifier 64 which, in the operating embodiment, is adjusted for a peak voltage level of 6.0 volts.

A separate opening 34 in the sensor mask 28 admits light to the segment D. Since the transmission of light to this photocell segment D is not interrupted by rotation of the code disk 16, the light intensity of the LED could be continuously monitored and controlled. In the present invention, neither the mask aperture 34 nor the photocell segment D need be provided.

Electrical current for driving the LED 12 was produced by the operational amplifier 64 and an NPN transistor 66, which are connected in a conventional circuit arrangement. The magnitude of electrical current at the output of this circuit is automatically adjusted to result in a current from the photocell segment D that is substantially equal to a reference current. The reference current is produced in a conventional manner using a zener diode 68 and a variable resistor 70, which is suitably trimmed, adjusted or selected.

It should be appreciated that, even in the prior art decoder system, the quadrature arrangement provided an "open window", a "closed window" (i.e., A, A') and two "half-open windows" (i.e., B and B', which were out of phase with the A-A' by 90 degrees). Accordingly, the photocells were collectively receiving illumination on most of the active area at all times, excluding the index cell.

A summation of the electrical signals produced by the corresponding photocell segments (A, A', B, and B') apparently hypothesized by Weber, could be utilized, continuously, as a measure of the light intensity of the LED 12, for regulation of the electrical drive current supplied thereto. This could result in a more compact photocell arrangement, since there would be no need for the separate photocell segment D, located beyond the perimeter of the code disk 16, and could permit use of the LED 12 and lens combination having a narrower beam angle. Weber, however, gave no suggestion as to how this might be accomplished.

Figure 3:
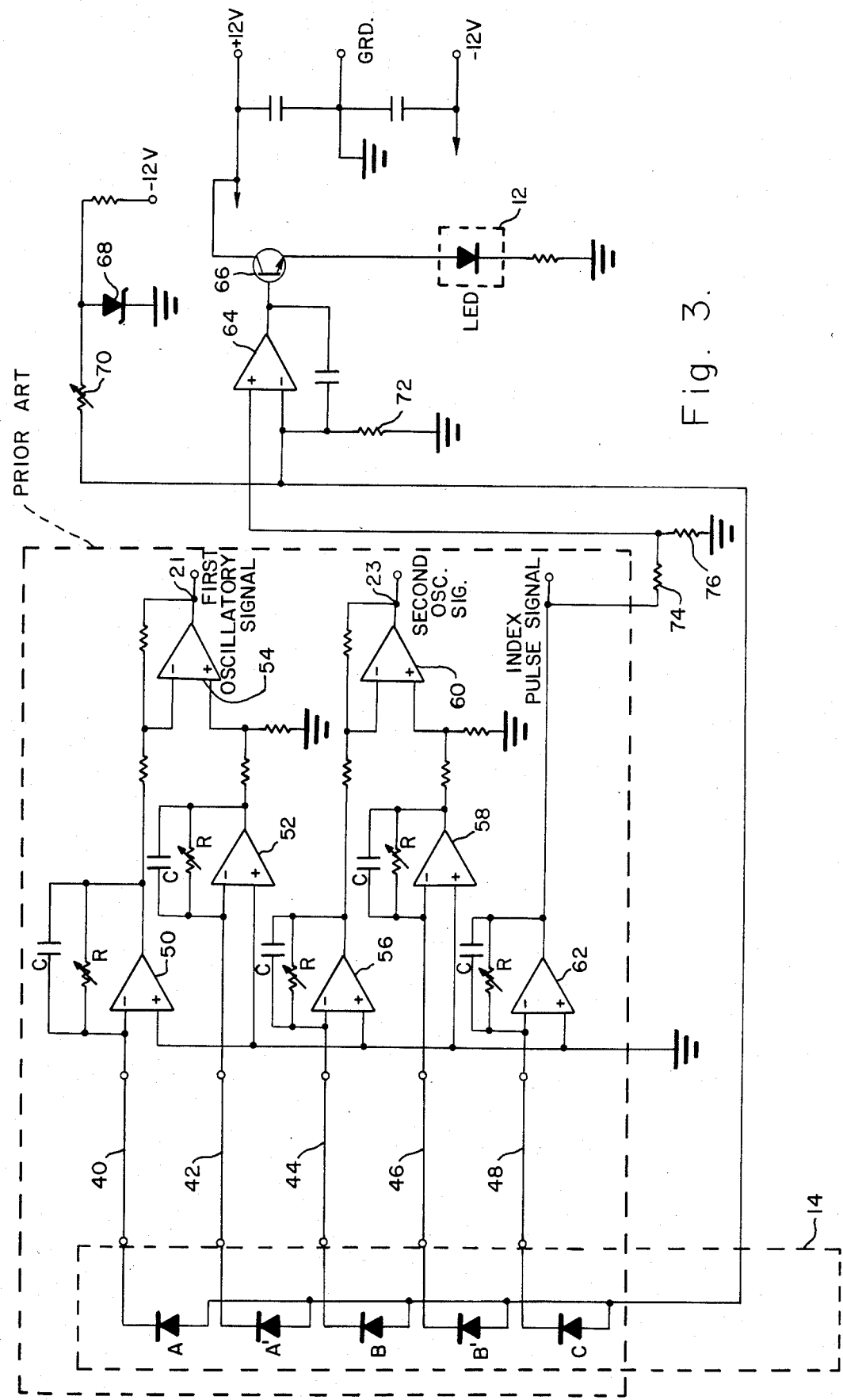
FIG. 3 is a circuit diagram of an encoder circuit including a preferred embodiment of the gain control circuit of the present invention.

According to the present invention, a circuit substantially similar to that of FIG. 2, but modified in accordance with the teachings of the present invention is shown in FIG. 3. A dashed block labeled "PRIOR ART" is used to enclose the combination of sensors, their operational amplifiers and the differential amplifiers that produce the first oscillatory signal, the second oscillatory signal and the index pulse signal, as in the PRIOR ART apparatus shown in FIG. 2.

For the purposes of the present invention, the sensor photodetector segment D is eliminated. Further, the connections to the feedback differential amplifier 64 are changed so that the commonly connected detector terminals are connected to the negative (−) input of the differential amplifier 64 and, through the variable resistor 70, to the source of potential that is clamped by the zener diode 68. The negative terminal of the differential amplifier 64 is also connected through a dropping resistor 72 to ground.

The positive (+) terminal of the differential amplifier 64 now is used to compensate for the periodic effects of the index pulse signal, which is received once each revolution of the decoder disc. The index photodetector segment C is shown commonly connected with the other photodetector segments. Therefore the index pulse signal is applied through a suitable resistor 74 to the positive (+) terminal of the differential amplifier 64. The positive terminal is also connected, through a dropping resistor 76, to ground.

In operation, as current is drawn by any of the photodetectors, the voltage at the negative input of the differential amplifier 64 will tend to drop. The bias of the negative terminal is determined by the setting of the variable resistor 70 and the clamping of the zener diode 68, which is balanced at the positive terminal, by the voltage at the summing junction of the resistors 74 and 76.

When no current is drawn by the photodetectors, the transistor 66 should be furnishing maximum voltage to the LED 12. As the voltage to the base of the transistor 66 is raised, it progressively reduces the voltage to the LED, thereby reducing the illumination impinging on the photodetectors.

When the index aperture iluminates the index segment C, the current drawn by the resistor 72 will increase, further dropping the voltage. However, this voltage drop at the negative terminal is balanced by a comparable voltage drop at the positive terminal of the differential amplifier 64, resulting from the output of the index pulse signal from the C amplifier 62. The net effect on the output through the differential amplifier 64 should be zero and, accordingly, the bias on the base of the transistor 66 remains unchanged. As a result, the illumination level of LED 12 is unaffected by a change in current through the index phototransducer.

Figure 4:
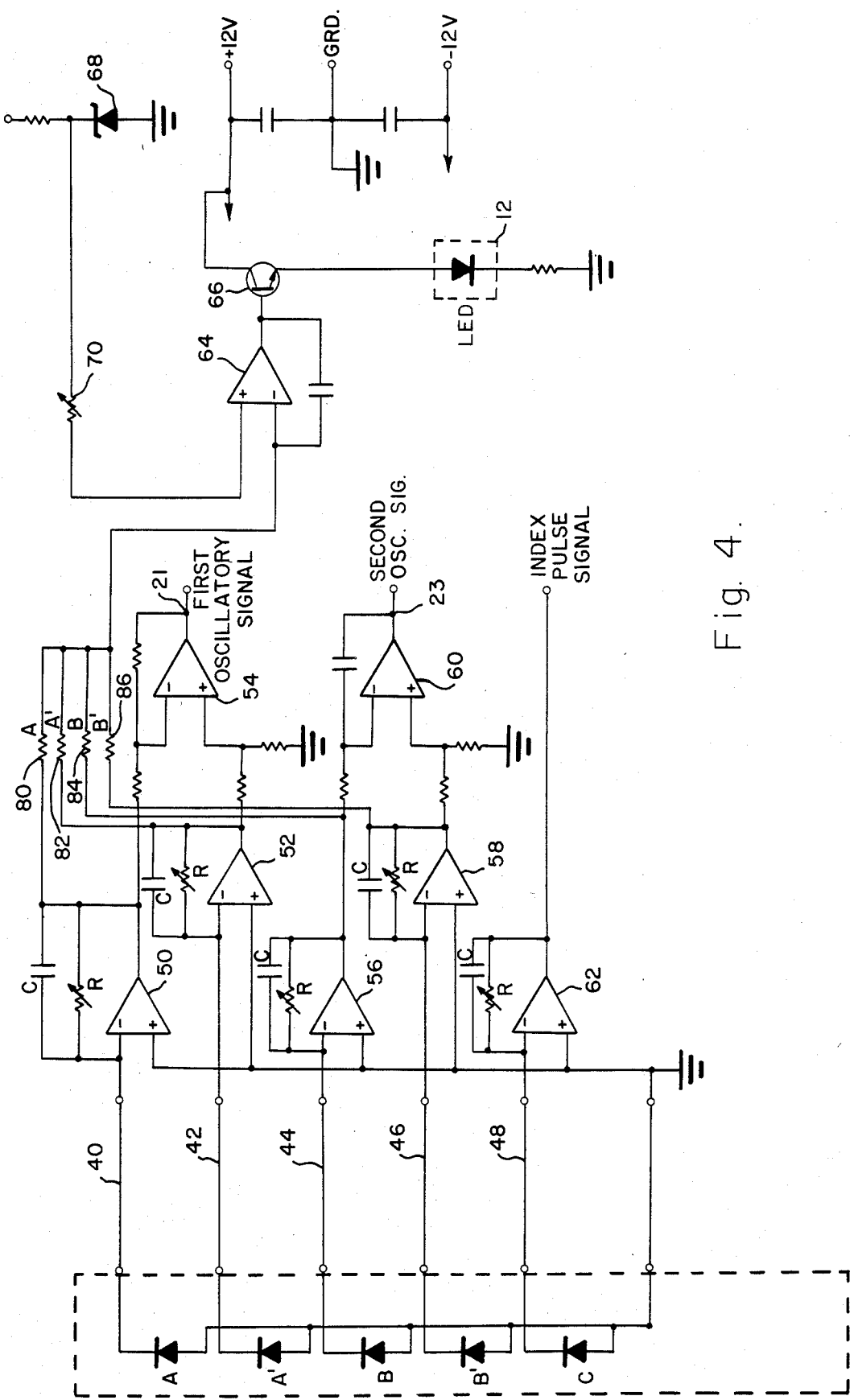
FIG. 4 is a block circuit diagram of an encoder circuit including an alternative embodiment of the present invention.

Other embodiments, which do not rely on the common connection of the phototransducers to a source of common reference, need not be concerned with the effects of the index pulse signals. One such embodiment is shown in FIG. 4. Here the outputs of the individual operational amplifiers 50 52, 56, 58 are taken and respectively applied to resistors 80, 82, 84, 86, which are tied to a summing junction.

The summing junction is applied to the negative (−) input of the differential amplifier 64. At the positive (+) terminal, the differential amplifier 64 receives a source of reference potential as clamped by the zener diode 68 through the variable resistor 70.

As the magnitude of the voltage at the summing junction changes, representing a change of intensity upon the four phototransducers, an appropriate signal is created at the differential amplifier 64 to control the light emitting diode 12. If the overall light intensity falls, thereby reducing the overall output of the several operational amplifiers, then the feedback circuit must increase the voltage to the LED 12 to increase the illumination. Conversely, if the illumination level is too high, then the voltage signal being fed back tends to reduce the voltage to the LED 12, thereby decreasing the illumination.

The present invention is equally applicable to those systems in which a push-pull arrangement is not employed or in which a first and second photodetector are utilized directly in the operating circuits. Such embodiments are shown in FIGS. 5 and 6.

Figure 5:
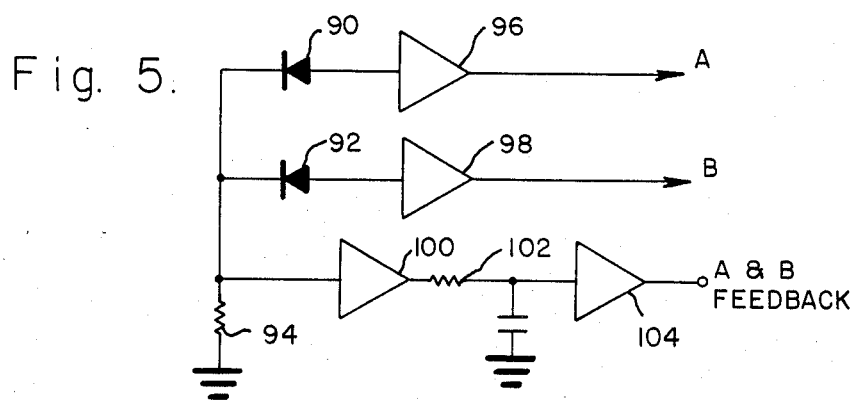
FIG. 5 is a circuit block diagram of an alternative embodiment of the present invention employing a filter.
Figure 6:
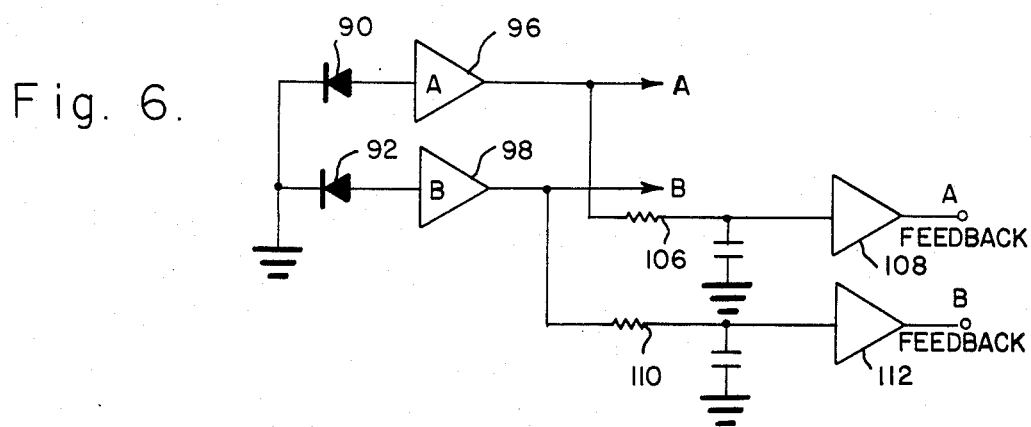
FIG. 6 is a block circuit diagram of an alternative to the embodiment of FIG. 5 employing a filter.

Turning first to FIG. 5, an A photodetector 90 and a B photodetector 92 has one of the terminals commonly connected through a dropping resistor 94 to a source of common reference potential, here shown by the conventional ground symbol. The output of the A and B detectors 90, 92 are respectively applied to A and B amplifiers 96, 98, which can be substantially the same as shown in the PRIOR ART circuit of FIG. 2, above.

Connected to one terminal of the dropping resistor 94 is a feedback amplifier 100, the output of which is connected to a low pass filter 102, shown here as an RC combination. The output of the filter is applied to a second, A+B amplifier 104, the output of which can be used in a feedback circuit similar to that shown in FIG. 3.

Because of the shuttering effect of the encoder disc, mask combination, the current drawn by the A and B detectors 90, 92 will vary between a dark current and a maximum light current. This AC current signal, converted to a voltage in the resistor 94, is amplified in the amplifier 100 and then filtered in the low pass filter 102 to provide a substantially DC signal to the A+B feedback amplifier 104. The resulting signal can be used in the same fashion as the feedback signal of the earlier embodiment.

Finally, turning to FIG. 6, there is shown an alternative embodiment for the two detector system. As shown in FIG. 6, the output of the A amplifier 96 is taken through a first, A filter 106 to an A feedback amplifier 108. The output of the B amplifier 98 can be applied through a second filter 110, and then to a B feedback amplifier 112. It is a matter of design choice whether both the A and B feedback signals would be utilized, or whether one would be deemed sufficient to control the gain of the light emitting diode.

Thus, there has been shown, in several embodiments, techniques which utilize the active photodetectors to control the gain of the light source in an encoder device. In some embodiments, the detectors are commonly connected through a resistor to a source of common reference potential. The current drawn by the photodetector is converted to a voltage which can be applied to an appropriate feedback circuit.

In other embodiments, the individual amplifiers, associated with the photodetectors, are used to provide the feedback signal. Where the presence of an index transducer which is periodically illuminated must be accounted for, an appropriate correcting circuit is provided.

According to the present invention, a separate photodetector cell is not required to monitor and control the output of a light source. If a push-pull arrangement, which provides a DC signal, is not available, a suitable, low pass filter can be included in the circuit, so that a DC feedback signal can be derived from the signals that are available.

Other variations and modifications will appear to those skilled in the art and accordingly, the invention should be limited only by the scope of the claims appended hereto.

What is claimed as new is:

1. A gain control circuit for controlling a radiating source that cooperates with photodetector means responsive thereto, said photodetector means receiving a predetermined average level of radiation on a substantially continuous basis, the photodetector means including a plurality of phototransducers, each respectively connected to an amplifier, comprising in combination:
   first means coupled to the photodetector means to provide a response signal corresponding to and representative of the radiation intensities continuously being received from the source, said first means including a summing junction connected to receive the outputs of each of said amplifiers;
   second means for establishing a reference level signal corresponding to a desired photodetector means output signal in response to an adequate level of received radiation; and
   feedback circuit means coupled to said first means summing junction, said second means and the radiating source, and operable in response to first and second means signals for controlling the radiating source to produce a level of radiation adequate to provide a first means signal having a predetermined relationship to said reference signal.

2. A gain control circuit for controlling a radiating source that cooperates with photodetector means including a plurality of phototransducers, each of the phototransducers being respectively connected to a separate amplifier, said photodetector means receiving a predetermined average level of radiation on a substantially continuous basis, comprising in combination:
- first means coupled to the photodetector means to provide a response signal corresponding to and representative of the radiation intensities continuously being received from the source said first means including integratorfilter means connected to one of the amplifier outputs for deriving the dc component of the amplifier output;
- second means for establishing a reference level signal corresponding to a desired photodetector means output signal in response to an adequate level of received radiation; and
- feedback circuit means coupled to said first means, said second means and the radiating source, and operable in response to the dc component signal from said first means and second means signals for controlling the radiating source to produce a level of radiation adequate to provide a first means signal having a predetermined relationship to said reference signal.

3. A gain control circuit for controlling a radiating source that cooperates with photodetector means responsive thereto, said photodetector means receiving a predetermined average level of radiation on a substantially continuous basis, including index phototransducer means illuminated only periodically by the radiating source comprising in combination:
- first means coupled to the photodetector means to provide a response signal corresponding to and representative of the radiation intensities continuously being received from the source;
- second means for establishing a reference level signal corresponding to a desired photodetector means output signal in response to an adequate level of received radiation;
- feedback circuit means coupled to said first means, said second means and the radiating source, and operable in response to first and second means signals for controlling the radiating source to produce a level of radiation adequate to provide a first means signal having a predetermined relationship to said reference signal; and
- third means coupled to the index phototransducer means and adapted to apply a correcting signal to compensate for the periodic signal contribution to the output of the photodetector means by the index phototransducer, whereby the periodic occurrence of a response from the index phototransducer means is accommodated and does not produce a momentary change in the radiating light source in response thereto.

4. The combination of claim 2, above, wherein the photodetector means include a plurality of phototransducers on a common substrate, a resistor connecting one terminal of the phototransducers to a potential source; and
- a feedback connection between said resistor and said feedback circuit means for applying said response signal to regulate the radiating source for maintaining the radiating source at an acceptable, predetermined level.

5. In a shaft encoder having a single light source and at least two photocells, receiving substantially constant average illumination levels, the shaft encoder also including an index photocell that is only periodically illuminated, a control circuit for maintaining the light source at an intensity sufficient to assure a desired magnitude of photocell response comprising:
- first means coupled to the photocells to generate a control signal corresponding to and representative of the continuous signal output of all the photocells in response to impinging radiation from the light source; and
- gain control means responsive to said control signal and coupled to the light source for maintaining the light source output at a level corresponding to a predetermined control signal level, and including compensating means, connected to receive an index photocell output signal for generating an offsetting signal to correct the feedback signal by an amount sufficient to counteract the contribution of the index photocell.

6. In a shaft encoder having a single light source and a plurality of photocells on a common substrate receiving substantially constant average illumination levels, a control circuit for maintaining the light source at an intensity sufficient to assure a desired magnitude of photocell response comprising:
- first means coupled to the photocells to generate a control signal corresponding to and representative of the continuous signal output of all the photocells in response to impinging radiation from the light source;
- gain control means, responsive to said control signal and coupled to the light source for maintaining the light source output at a level corresponding to a predetermined control signal level; and
- a plurality of amplifiers each coupled to receive the output signal of each photocell of the plurality, said first means being connected to receive the output of all of said amplifiers at a summing junction to provide said control signal.

7. In a shaft encoder having a single light source and a plurality of photocells on a common substrate receiving substantially constant average illumination levels, a control circuit for maintaining the light source at an intensity sufficient to assure a desired magnitude of photocell response comprising:
- a plurality of amplifiers each coupled to receive the output of a different photocell;
- first means connected to receive the output of at least one of said amplifiers to generate a control signal corresponding to and representative of the continuous signal output of all the photocells in response to impinging radiation from the light source;
- gain control means, responsive to said control signal and coupled to the light source for maintaining the light source output at a level corresponding to a predetermined control signal level; and
- filter integrating means for generating a substantially d.c. control signal to said gain control means.

* * * * *